(12) United States Patent
Wald

(10) Patent No.: US 6,930,521 B2
(45) Date of Patent: Aug. 16, 2005

(54) CIRCUIT FOR CONTROLLING THE PERFORMANCE OF AN INTEGRATED CIRCUIT

(75) Inventor: Steven F. Wald, Meridian, ID (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/611,131

(22) Filed: Jun. 30, 2003

(65) Prior Publication Data

US 2004/0263212 A1 Dec. 30, 2004

(51) Int. Cl.[7] .............................................. H03L 7/06
(52) U.S. Cl. ..................................... 327/147; 327/156
(58) Field of Search ................................ 327/147, 148, 327/154, 156, 157, 162, 163; 331/11, 25, DIG. 2, 1 A; 375/373, 374, 375

(56) References Cited

U.S. PATENT DOCUMENTS 5,033,306 A * 7/1991 Tamura ....................... 73/755
5,783,972 A * 7/1998 Nishikawa ................... 331/17
6,320,469 B1 * 11/2001 Friedberg et al. ........... 331/1 A
6,492,840 B1 * 12/2002 Bellaouar .................... 326/99
2003/0154453 A1 * 8/2003 Gauthier et al. ............. 716/5

\* cited by examiner

*Primary Examiner*—Linh My Nguyen

(57) ABSTRACT

A system and method for utilizing a feedback-based delay stabilization and power optimization circuit. One embodiment of the present invention is directed to an electronic circuit comprising an indicator operable to generate an indicator signal that is proportional to an actual operating speed of an integrated circuit that includes the indicator; and a comparator operable to compare the indicator signal to a reference signal and to generate from the comparison an error signal that is proportional to a difference between the operating speed and a desired operating speed. A signal combining circuit may then generate a feedback signal for a power supply based upon the error signal and an output signal of the power supply.

20 Claims, 3 Drawing Sheets

CIRCUIT FOR CONTROLLING THE PERFORMANCE OF AN INTEGRATED CIRCUIT

BACKGROUND OF THE INVENTION

The performance of an integrated circuit (IC) typically depends on several parameters that influence the speed at which the IC operates. Three such parameters are the IC's voltage supply, the IC's operating temperature, and the thickness of the IC's transistor-gate oxides. Variations in these parameters from respective nominal values may affect the delay time of signals that propagate within the IC, and thus, may vary the operating speed of the IC from a nominal speed. For example, if the voltage supply is lower than the nominal value, logic gates within the IC may operate more slowly because the rise times between logic-0 and logic1 are longer due to the lower drive signal. Similarly, as the temperature of the IC decreases logic circuits operate more quickly due to the decrease in the transistor on resistances. Furthermore, the thinner the gate-oxides, the faster the transistors, and thus, the faster the logic circuits. Conversely, the higher the supply voltage, the more quickly the logic gates operate, and the higher the temperature or the thicker the gate-oxides, the more slowly the logic gates operate.

Because these parameters may vary, the IC manufacturer typically accommodates these variations by predicting a best-case scenario and a worst-case scenario and designing the IC for a nominal case that is between the best- and worst-case scenarios. In a best-case scenario, the voltage supply is at its highest rated value, the IC operates at its lowest rated temperature, and the manufacturing process parameters (e.g., gate-oxide thickness) have their "fastest" values, such that the IC operates at its highest speed. Conversely, in the worst-case scenario, the voltage supply is at its lowest specified level, the temperature of the IC is at its highest rated value, and the manufacturing-process parameters have their "slowest" values, such that the IC operates at its slowest speed. By predicting the worst-case parameter values, an engineer can typically design an IC to operate adequately even under worst-case conditions.

However, it is becoming more difficult to design an IC to operate properly over the range from worst-case to best-case conditions. For example, a designer may include compensation circuitry on the IC to stabilize the IC's operation over this range. But, as ICs become more dense (more transistors per unit area), there is less area in which to include compensation circuitry. Moreover, as ICs include more circuitry, the time for an engineer to design an IC that can operate over a wide range of parameter variations increases, thus, increasing the design time and time to market.

Therefore, a need has arisen for a new way to compensate for the affect that parameter variations have on the operation of an IC.

SUMMARY OF THE INVENTION

One aspect of the present invention is directed to a system and method for utilizing a feedback-based delay stabilization and power optimization circuit. One embodiment of the present invention is directed to an electronic circuit comprising an indicator operable to generate a indicator signal that is proportional to an actual operating speed of an integrated circuit that includes the indicator; and a comparator operable to compare the indicator signal to a reference signal and to generate from the comparison an error signal that is proportional to a difference between the operating speed and a desired operating speed. A signal combining circuit may then generate a feedback signal for a power supply based upon the error signal and an output signal of the power supply.

One advantage of a circuit realized according to an embodiment of the invention is that a manufacturer of a typical integrated circuit can design a circuit with a smaller ratio between the delays associated with the best-case and worst-case scenarios. In one a conventional system, the ratio between the frequency of the best-case scenario and the worst-case scenario of a conventional system is approximately 2.4. In one embodiment of the invention, using a feedback-based delay stabilization circuit to adjust the power supply voltage results in the ratio from best-case to worst-case scenarios being improved to 1.3. Therefore, knowing this reduced ratio, a manufacturer can design the integrated circuit with an overall delay time that is smaller, and more efficient with less design effort.

Another advantage of using a feedback-based delay stabilization circuit is the optimization of power use from the power supply for the integrated circuit. As the frequency of the monitored circuit is at its highest, i.e., best-case scenario, the voltage from the voltage supply may be adjusted lower since voltage compensation is not required to overcome other variations. As a result, power is saved at operating temperatures or process characteristics that are near the best-case scenario.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

Generally, a technique according to an embodiment of the invention calls for controlling one or more operating parameters of an IC such that the IC operates closer to its nominal operating point than it would without this parameter control. Therefore, this technique allows the IC designer more leeway when designing the IC, because the parameter control effectively reduces the range between the worst-case and best-case operating points.

Figure 1:
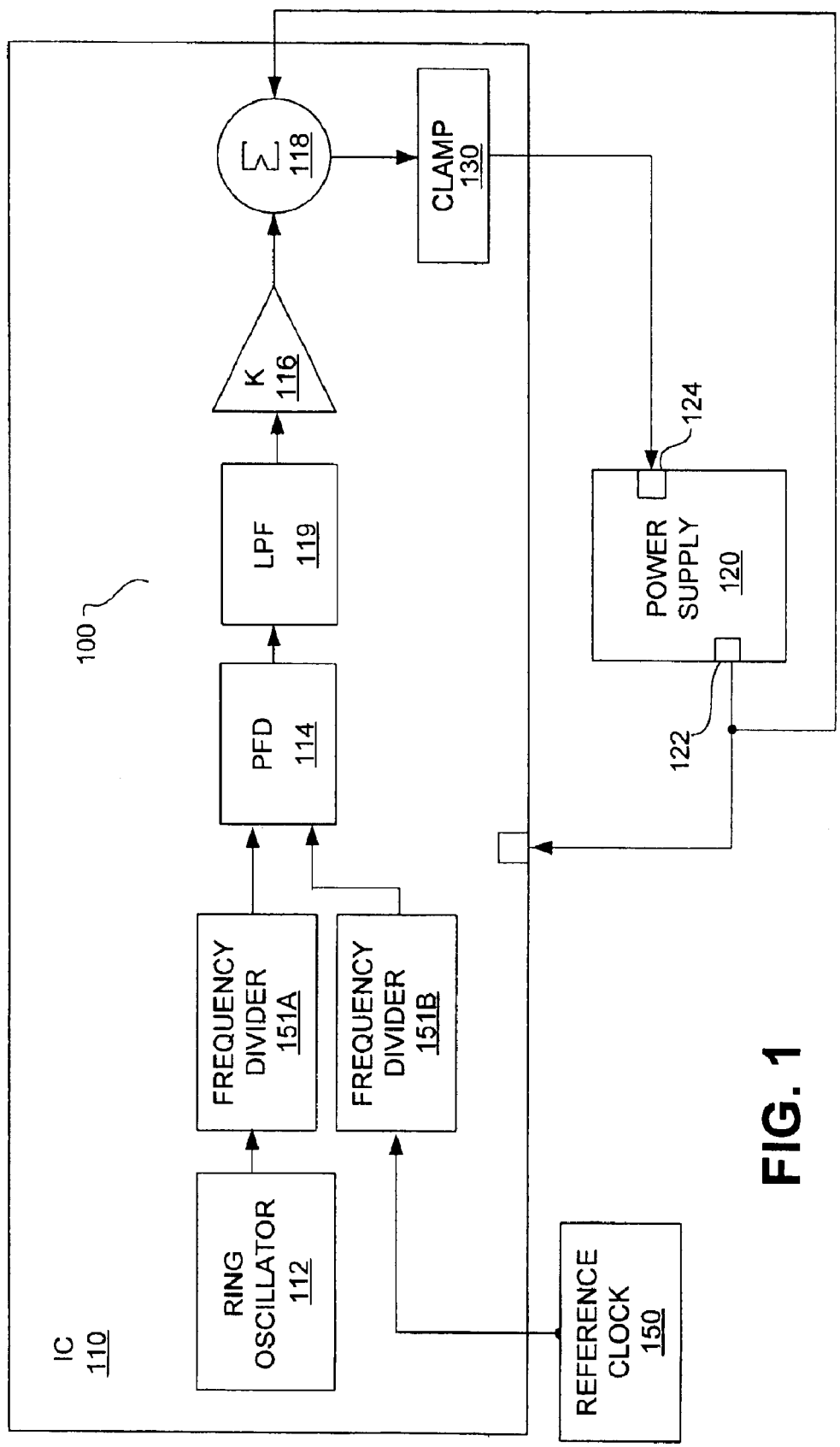
FIG. 1 is a block diagram of a feedback-based delay stabilization circuit according to an embodiment of the invention.

FIG. 1 is a block diagram a feedback-based delay-stabilization circuit 100, which forces an IC 110 toward or to its nominal operating point by controlling the level of the supply voltage to the IC 110 according to an embodiment of the invention. The circuit 100 is coupled to a power supply 120, which provides power to the IC 110. The circuit 100 monitors the frequency of a signal—here a signal from a ring oscillator 112—within the IC 110 and is able to adjust the supply voltage from the power supply 120 in response to a change in the frequency of the monitored frequency. The circuit 100 includes the ring oscillator 112, one or more frequency dividers 151A and 151B, a phase-frequency detector 114 (PFD), a low-pass filter 119 (LPF), a biasing block 116, a signal combining block 118, and a clamp 130, all of which are described in greater detail below.

Because the ring oscillator 112 is disposed on the IC 110, the frequency of the signal output from the ring oscillator is proportional to the operating point of the IC 110. The ring oscillator 112 is designed such that its output signal has a nominal value when the IC 110 is operating at its nominal operating point, i.e., when the parameters such as supply voltage, temperature, and gate-oxide thickness are all at their nominal values. But if these operating parameters are on average skewed toward a best-case operating condition, then the frequency of the oscillator signal is higher than the nominal value, and thus reflects that the IC 110 is operating "faster" than nominal. Conversely, if these parameters are on average skewed toward a worst-case operating condition, then the frequency of the oscillator signal is lower than the nominal value, and thus reflects that the IC 110 is operating "slower" than nominal. Consequently, the frequency of the oscillator signal provides a noninvasive measurement of the operating point of the IC 110. And as the operating point of the IC 110 fluctuates due to changes in the operating parameters, the frequency of the oscillator signal also changes, thus tracking the fluctuations in the operating point. For example, if the temperature of the IC 110 rises or the supply voltage falls, then the frequency of the oscillator signal will decrease, thus indicating the slower operation of the IC 110. Conversely, if the temperature falls or the supply voltage rises, then the frequency of the oscillator signal will increase, thus indicating the faster operation of the IC 110.

As discussed below, one can use the ring oscillator 112 to drive the IC 110 toward its nominal operating point. Specifically, the feedback circuit 100 controls the supply voltage to the IC 110 so as to drive the frequency of the oscillator signal toward its nominal value, and thus, drive the IC 110 toward its nominal operating point. More specifically, a reference-clock generator 150, which is external to the IC 110, generates a signal having the nominal frequency of the ring oscillator 112. Alternatively, if the generator 150 does not generate the reference clock having the nominal frequency of the oscillator 112, then one or both of the frequency dividers 151A and 151B may be programmed so that the generator 150 effectively generates the reference clock having the nominal frequency. For example, suppose that the nominal frequency is 100 MHz, but that the generator 150 generates a 200 MHz reference clock. Then, one can program the divider 151B to divide the frequency of the reference clock by two.

The outputs of the ring oscillator 112 and the reference-clock generator 150 (possibly divided by the frequency dividers 151A and 151B) are fed into the PFD 114, which generates a binary up/down voltage error signal, signifying which of the two frequencies is higher. The LPF 119 smoothens the voltage error to set the bandwidth of the feedback loop formed by the circuit 100 and the power supply 120. The resulting filtered signal is then input to a biasing block 116 that limits and/or otherwise adjusts the voltage error signal. For example, the error signal, if left unbiased, may cause the power supply 120 to provide a supply voltage $V_{DD}$ that is higher than the IC 110 can tolerate. Therefore, there may be conventional circuitry within the biasing block 116 to limit the supply voltage to an acceptable level. Further, the biasing block 116 may be used to manipulate the error signal to a magnitude-based error signal or a percentage-based error signal.

The biased voltage-error signal is input to a signal combining block 118 that combines the error signal with the supply voltage $V_{DD}$. If the error signal is a magnitude-based error signal, then the two inputs to the combining block 118 are summed as is shown in FIG. 1. In an alternative embodiment, the error signal is a percentage-based error signal, in which case, the two inputs are multiplied. For example, suppose the power supply 120 is designed to maintain $V_{DD}$ at the same voltage that is provided to the sense input 124, the present supply voltage is 1.0 V, and the supply voltage $V_{DD}$ that will cause nominal operation of the IC 110 is 1.1 V. Therefore, one can design the circuit 100 such that under these instantaneous conditions, the bias circuit 116 will generate a 0.1 V magnitude-based error signal. Consequently the combiner 118 will sum with $V_{DD}$=1 to obtain the desired 1.1 V feedback signal, which causes the supply to generate the desired $V_{DD}$=1.1V. Alternatively assuming the same instantaneous conditions, one can design the circuit 100 such that the circuit 116 will generate a 110% percentage-based error signal. Consequently the combiner 118 will multiply $V_{DD}$=1 by 1.1 (110%) to obtain the desired 1.1 V feedback signal, which causes the supply to generate the desired $V_{DD}$=1.1V.

Once the supply voltage $V_{DD}$ is adjusted to a level that causes nominal operation of the IC 110, the frequency of the ring-oscillator signal then has the nominal value, i.e., the same frequency as the reference clock, thus stabilizing the IC 110 at its nominal operating point.

If the power supply 120 does not have a feedback node 124, then a voltage regulator (not shown) may be included either on or off the IC 110 to allow the above-described control of the supply voltage $V_{DD}$.

To summarize, the circuit 100 and the power supply 120 form a voltage-lock loop for controlling $V_{DD}$ 122 based on the difference between the frequency of the ring-oscillator signal 112 and the reference-clock. If the ring-oscillator frequency is lower than its nominal value, then the circuit 100 causes the supply 120 to increase the level of $V_{DD}$ so as to speed up the operation of the IC 110; conversely, if the ring-oscillator frequency is higher than its nominal value, then the circuit 100 causes the supply 120 to decrease the level of $V_{DD}$ so as to slow down the operation of the IC 110.

Still referring to FIG. 1, a clamp 130 allows one to set limits for the maximum and minimum levels of $V_{DD}$. For example, if $V_{DD}$ 122 is too high, then the IC 110 may be damaged. Likewise, if $V_{DD}$ 122 is too low, then the integrated circuit may cease to function at all. As such, the voltage clamp circuit 130 may be placed between the combining block 112 and the sense input 124 such that voltage limits are imposed on the levels allowed for $V_{DD}$. For example, where the IC 110 is designed for a nominal voltage input of 5.0 volts, the voltage clamp circuit 130 limits the maximum allowable level of $V_{DD}$ to 5.7 volts and the minimum allowable level to 4.3 volts. Although the clamp 130 may prevent the circuit 100 from driving the IC 110 all the way to its nominal operating point, it typically allows the circuit 100 to drive the IC 110 closer to its nominal operating point than it would be without the circuit 100.

In one embodiment of the invention, the voltage clamp circuit 130 is realized by using an analog-to-digital converter (not shown) to convert the feedback signal from the combiner 118 to a digital value. The analog-to-digital converter may have a limit such that when the analog feedback signal exceeds a maximum or minimum limit, the analog-to-digital converter claims the digital value to a respective predetermined maximum or minimum value, thus clamping $V_{DD}$ at a respective predetermined maximum or minimum voltage level. This clamped digital value may be provided directly to the feedback node 124, or the circuit 130 may convert the clamped digital value back to an analog signal with a digital-to-analog converter (not shown).

In another embodiment of the invention, the IC 110 may be powered by more than one power supply 120. For example, a core power supply (not shown) and an I/O voltage supply (not shown) can be respectively used to power the core (e.g., memory or logic array) and the I/O circuitry of the IC 110. As an example, the core power supply may be used to power the internal logic functions of the IC 110 and the I/O power supply may be used to power the input/output drivers of the IC 110. The core supply voltage is often lower than the I/O supply voltage. For example, in a typical 0.13-micron process, the core supply voltage may be between 0.9 and 1.2 V and the I/O supply voltage between 3.0 and 3.5 V. Because the speed of the core is often more critical to the operation of the IC 110 than the speed of the I/O circuitry, the ring oscillator 112 may be formed in the same region of the IC 110 as the core, and thus the IC 110 may include one circuit 100 to control only the core supply voltage. Alternatively, a second ring oscillator disposed in the same region of the IC 110 as the I/O circuitry and a second circuit 100 may be used to control the I/O supply voltage. Or a single circuit 100 may be used to control both the core and I/O supply voltages.

In another embodiment, the operating point of the IC 110 may be measured by means other than the ring oscillator 112. For example, the IC 110 may include a circuit (not shown) for generating a voltage signal (not shown) that is dependent on temperature or on process variations such as gate-oxide thickness. The IC 110 may also include a comparison circuit (not shown) to compare this voltage signal to a voltage reference (internal or external, not shown), and to control $V_{DD}$ as discussed above based on this comparison. That is, the dependent voltage signal effectively takes the place of the signal from the ring oscillator 112.

Figure 2:
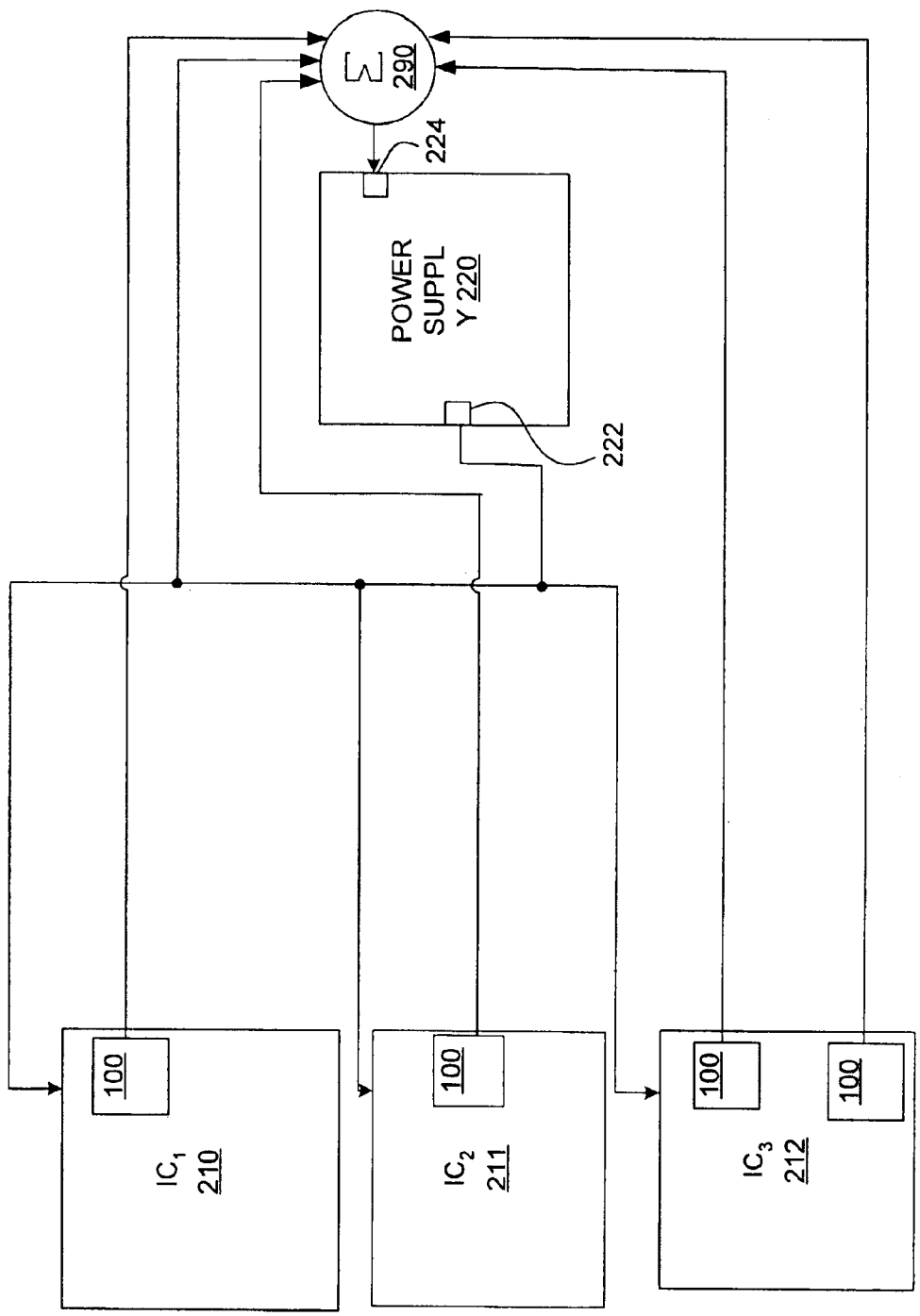
FIG. 2 is a block diagram of an electronic system that includes more than one of the feedback-based delay stabilization circuit of FIG. 1 according to an embodiment of the invention.

FIG. 2 shows an embodiment of the invention where a system includes multiple ICs powered by a common supply 220 and each having a respective feedback circuit 100 of FIG. 1 (the IC 212 has two feedback circuits 100 as discussed below). Generally, the circuits 100 act in concert to set the common supply voltage $V_{DD}$ to a "best fit" value. Although this scheme may not force the ICs as close to their respective nominal operating points as if each IC were powered by a separate supply, it often does force the ICs closer to their respective nominal operating points as compared to a situation where the circuits 100 are omitted.

More specifically, a power supply 220 may be used to supply power to a number of different integrated circuits, such as $IC_1$ 210, $IC_2$ 211, and $IC_3$ 212. A respective feedback-based delay stabilization circuit 100—minus the combiner 118 and clamp 130—is included in the ICs 210, 211, and 212. A common combiner 290 combines each of the feedback signals and the supply voltage $V_{DD}$ in a predetermined manner to generate a master feedback signal. For example, the combiner 290 may divide the value of each feedback signal by the number of feedback signals, and then sum the results with the supply voltage. This causes the supply 220 to generate a level for $V_{DD}$ that takes into account the average value of he feedback signals. Alternatively, if the operation of one of the ICs is more critical than the operation of the other ICs, then the combiner 290 may weight the feedback signal from that IC more highly than the feedback signals from the other ICs such that the fractional weights of each feedback signal sums to unity.

Still referring to FIG. 2, an IC may include more than one feedback-based delay stabilization circuit 100 as shown with respect to $IC_3$ 212. In a situation such as this, the operating point at more than one area of the $IC_3$ 212 is monitored. A common reference-clock generator 150 (shown in FIG. 1 but not shown here for clarity) may supply a common reference clock to the circuits 100, or a respective generator 150 generating the same or different reference frequencies may be provided for each circuit 100. Furthermore, the IC 212 may be supplied by more than one power supply 220 (only one supply shown in FIG. 2). As such, the first circuit 100 may be associated with the first power supply 220 and the second circuit 100 may be associated with the second power supply.

Figure 3:
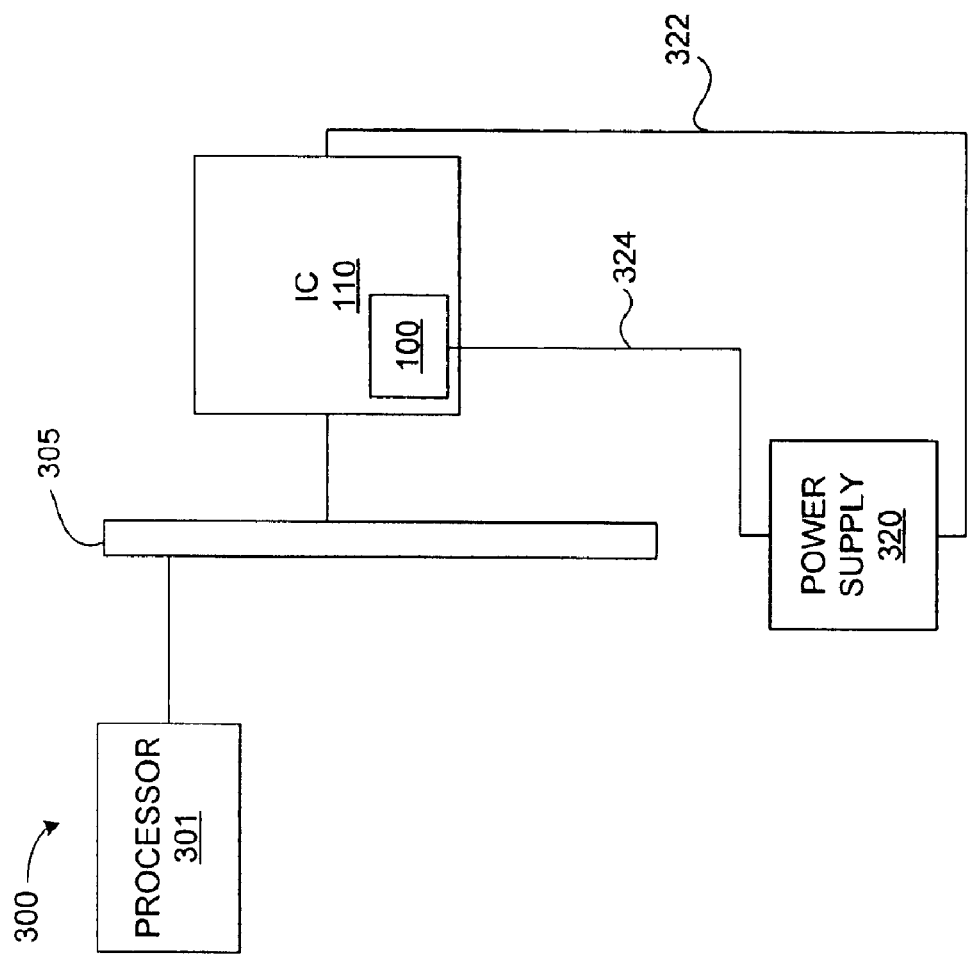
FIG. 3 is a block diagram of an electronic system that includes feedback-based delay stabilization circuit of FIG. 1 according to an embodiment of the invention.

FIG. 3 is a block diagram of an electronic system, such as a computer system 300 that includes an IC 110 having a feedback-based delay-stabilization circuit 100 of FIG. 1. The electronic system includes a processor 301 coupled to a bus 305. The bus 305 is coupled to the IC 110, which may communicate with the processor 301 via the bus 305. The IC 110, which may be a memory device, is powered by an associated power supply 320 via a $V_{DD}$ connection 322. As discussed above in conjunction with FIG. 1, the circuit 100 generates a feedback signal (based on a comparison to a reference signal from a reference clock which is not shown for clarity) on a sense input line 324 which is coupled to a sense input terminal of the power supply 320. As such, $V_{DD}$ is adjusted based upon the operating speed of the IC 110 as described above.

The preceding discussion is presented to enable a person skilled in the art to make and use the invention. The general principles described herein may be applied to embodiments and applications other than those detailed below without departing from the spirit and scope of the present invention. The present invention is not intended to be limited to the embodiments shown, but is to be accorded the widest scope consistent with the principles and features disclosed or suggested herein.

I claim:

1. An operating-speed control circuit, comprising:
   an indicator circuit operable to generate an indicator signal that is proportional to an actual operating speed at which signals propagate through an integrated circuit that includes the indicator;
   a comparator operable to compare the indicator signal to a reference signal and to generate from the comparison an error signal that is proportional to a difference between the actual operating speed and a desired operating speed; and
   a feedback circuit for a power supply that is operable to control the power supply based on a combination of the error signal and a signal from the power supply.

2. The circuit of claim 1, wherein the indicator circuit comprises a ring oscillator operable to oscillate at a frequency that is proportional to the operating speed of the integrated circuit.

3. The circuit of claim 1 wherein the indicator circuit comprises a temperature-sensitive circuit operable to generate a voltage signal that is proportional to the operating speed of the integrated circuit.

4. The circuit of claim 1 wherein the comparator comprises a phase-frequency detector operable to compare a frequency of the indicator signal to a frequency of the reference signal to generate the error signal.

5. The circuit of claim 4, further comprising a biasing circuit coupled with the comparator and operable to bias the error signal.

6. The circuit of claim 5, further comprising a combining circuit operable to combine the error signal with a power-supply signal to generate a feedback signal.

7. The circuit of claim 6, further comprising a clamping circuit coupled to the combining circuit and operable to limit the magnitude of the feedback signal.

8. The circuit of claim 7 wherein the clamping circuit comprises:
an analog-to-digital converter operable to convert the feedback signal into a digital signal and to limit the digital signal to within a predetermined range; and
a digital-to-analog converter operable to convert the digital signal into a limited analog feedback signal.

9. The circuit of claim 1, further comprising a low-pass filter coupled to the comparator and operable to filter the error signal.

10. A power-supply control circuit comprising:
a detector operable to generate a detector signal having a frequency that is proportional to the speed at which an integrated circuit that incorporates the detector is operating;
a comparator coupled to the detector and operable to compare the frequency of the detector signal to the frequency of a reference signal and to generate an error signal based upon the difference between the frequency of the detector signal and the frequency of the reference signal; and
a signal-combining circuit operable to generate a feedback signal for a power supply from the error signal and a voltage from the power supply.

11. An electronic system comprising:
a power supply operable to generate a supply signal;
an integrated circuit coupled to the power supply;
an indicator operable to generate an indicator signal that is proportional to an actual operating speed at which signals propagate through integrated circuit;
a comparator coupled to the power supply and to the indicator and operable to compare the indicator signal to a reference signal to generate from the comparison an error signal that is proportional to a difference between the actual operating speed and a desired operating speed, and to control the power supply with the error signal; and
a feedback circuit for the power supply that is operable to control the power supply based on a combination of the error signal and a signal from the power supply.

12. The electronic system of claim 11, further comprising a reference clock coupled to the integrated circuit and operable to generate the reference signal.

13. The electronic system of claim 11, further comprising a frequency divider coupled between the reference clock and the comparator and operable to generate from the reference signal an intermediate reference signal having a predetermined frequency.

14. The electronic system of claim 11, further comprising:
a second integrated circuit coupled to the power supply;
a second indicator operable to generate a second indicator signal that is proportional to an actual operating speed of the second integrated circuit; and
a second comparator coupled to the power supply and to the second indicator and operable to compare the second indicator signal to a reference signal to generate from the comparison a second error signal that is proportional to a difference between the operating speed of the second integrated circuit and a desired operating speed, and to control the power supply with the second error signal.

15. A method, comprising:
determining a difference between an actual operating speed in which a signal propagates through an integrated circuit and a desired operating speed of the signal; and
generating an error signal based on the determined difference; and
forcing the actual operating speed of the signal toward the desired operating speed based on the determined difference after combining the error signal with a power supply signal.

16. The method of claim 15 wherein determining the difference comprises comparing a frequency corresponding to the actual operating speed to a frequency corresponding to the desired operating speed.

17. The method of claim 15 wherein the forcing comprises adjusting the voltage of a power supply that is supplying voltage to the integrated circuit.

18. A method, comprising:
determining a difference between a frequency of an indicator signal generated on an integrated circuit and a reference frequency
generating an error signal based on the determined difference; and
adjusting a voltage supplied to the integrated circuit based upon a combination of the error signal and a voltage signal.

19. The method of claim 18 wherein adjusting the voltage comprises:
decreasing the voltage when the frequency of the indicator signal is higher than the reference frequency; and
increasing the voltage when the frequency of the indicator signal is lower than the reference frequency.

20. The method of claim 18 wherein adjusting comprises maintaining the voltage within a predetermined range when the difference is outside of a second predetermined range.

* * * * *